United States Patent [19]

Comerford

[11] Patent Number: 4,566,624
[45] Date of Patent: Jan. 28, 1986

[54] MASS WAVE SOLDERING SYSTEM

[75] Inventor: Matthias Comerford, Newton Highlands, Mass.

[73] Assignee: Hollis Automation, Inc., Nashua, N.H.

[21] Appl. No.: 562,407

[22] Filed: Dec. 16, 1983

[51] Int. Cl.⁴ .............................................. H05K 3/34
[52] U.S. Cl. .................... 228/180.1; 228/37; 228/262; 118/410; 118/58; 427/96; 427/88
[58] Field of Search ...................... 228/57, 125, 180 R, 228/37, 43, 262, 56 A, 20, 22; 118/410, 413, 74, 58; 427/96, 88

[56] References Cited

U.S. PATENT DOCUMENTS 3,190,527 6/1965 Tardoskegyi .......................... 228/37
3,500,536 3/1970 Goldschmied ........................ 228/37
4,171,761 10/1979 Boldt .................................... 228/37

FOREIGN PATENT DOCUMENTS 0872085 10/1981 U.S.S.R. ............................... 228/37

Primary Examiner—Nicholas P. Godici
Assistant Examiner—C. McKee
Attorney, Agent, or Firm—Hayes, Davis & Soloway

[57] ABSTRACT

Contact of a soldered board by a soldering oil supplied from within a solder wave takes place immediately following deposition of molten solder onto the board. The oil causes relocation of solder on and/or removal of excess solder from the underside of the board, and any interconnections, component leads and/or component bodies carried thereon before the solder solidifies as shorts, icicles or bridges.

34 Claims, 7 Drawing Figures

MASS WAVE SOLDERING SYSTEM

The present invention relates to systems for soldering electrical and electronic components onto substrate circuit boards, and more specifically to an improved apparatus and method for mass soldering electrical and electronic components by their leads, to printed circuit boards or the like.

Various soldering systems are well known in the art for mass soldering electrical and electronic components, by their leads, onto printed circuit boards. One technique for mass soldering components to circuit boards is that of dip soldering. With this technique, the entire side of a circuit board containing the printing wiring, with the leads from the components projecting through apertures in the board, is engaged for a certain period of time with the surface of a bath of molten solder, and then removed. Another technique for mass soldering components onto circuit boards is that of wave soldering. A typical prior art wave soldering system generally comprises a container adapted to hold a supply of molten solder and a sump partially submerged in the molten solder. The sump has an intake orifice below the surface of molten solder, and an elongate horizontal nozzle or slot above the surface of the solder. A positive displacement pump is submerged in the body of solder and is adapted to force molten solder into the sump intake orifice, where the molten solder then flows upward in the sump and out the horizontal nozzle to thereby produce a smoothly rounded standing wave of molten solder above the nozzle. Other techniques for mass soldering electrical and electronic components onto the printed circuit boards are well known in the art and include cascade soldering, jet soldering and drag soldering. So-called "leadless" components such as flat packs can also be mass soldered to circuit boards by fixing the components to the bottom of a board, e.g. as by fixturing or with an adhesive, and then engaging the bottom of the board and the components with molten solder. While known mass soldering systems have provided substantial manufacturing economy to the electronics industry and thus achieved substantial commercial use, the deposition of excess solder on the board circuits, connections and leads has been a continual problem. Deposition of excess solder may result in formation of shorts, icicles and/or bridges, and will increase solder consumption and finished board weight. Moreover, current trends in the electronics industry to relatively high density electronic assemblies has increased the problem of solder shorts, icicling and bridging.

The prior art has devised various techniques to solve the problems of solder shorts, icicling and bridging. For example, for wave soldering, one technique which has become virtually universally adopted by the industry is to incline the travel path of the circuit boards through the solder wave, i.e. from the horizontal, to increase the exit angle between the board being soldered and the solder wave. The art has also devised various wave geometries for further increasing the exit angle and/or changing the point where a circuit board exits the wave. While increasing the exit angle of the board from the wave has been found to reduce substantially the incidence of solder shorts, bridges and/or icicling, this has not entirely eliminated solder shorts, bridges and icicling, particularly in cases where relatively high density electronic assemblies and/or relatively long lead components are being soldered. Moreover, inclining the conveyer, i.e. so as to increase the exit angle increases the height of the soldering system and also coplicates the transport system between the assembly station and the cleaning station which normally employ horizontal conveyers. Modifying the sump and nozzle to increase the exit angle and/or changing the point where the circuit board exits the wave complicates wave geometries and control.

Another system for reducing the incidence of solder shorts, icicling and bridging, which has achieved substantial commercial acceptance, is to intimately mix soldering oil in the solder wave in accordance with the teachings of Walker et al U.S. Pat. No. 3,058,441. While such systems have been found to reduce substantially the incidence of solder shorts, bridging and/or icicling, such systems have not entirely eliminated solder shorts, bridges and icicling, particularly in cases where relatively high density electronic assemblies and/or relatively long lead components are being soldered to circuit boards.

A more recent development in mass soldering systems and which also has achieved substantial commercial acceptance, is described in Canadian Pat. No. 1091102, Canadian Pat. No. 109641, and U.S. patent applications of Harold T. O'Rourke, Ser. Nos. 951052 and 409,849, filed Oct. 12, 1978 and Aug. 20, 1982, respectively, for Mass Soldering System, all assigned to the assignee of the present application. The aforesaid Canadian Patents and U.S. applications disclose mass soldering systems wherein after the board has been contacted with the molten solder, excess solder deposited by the soldering process is removed by impinging a stream of heated gas onto the freshly deposited solder before it solidifies on the board. In practice, a stream of heated air is directed onto the underside of the board from one or more fluid jets, fluid lenses, slots, nozzles or the like located immediately downstream of the mass soldering station and directed at a relatively acute angle (30° to 60°) to the underside surface of the board. While such systems have been found to eliminate substantially the incidence of solder shorts, bridging and/or icicling in mass soldering operations as will be appreciated such systems impose increased energy demands, i.e. for generating the necessary heated gas stream.

Yet another recent development which purportedly reduces solder shorts, bridging and/or icicling in a mass soldering operation is described in U.K. Patent Application G.B. No. 2112688A, Published July 27, 1983, as described in the aforesaid U.K. published Patent Application a static pool of hot oil having a specific gravity lower than solder is floated in a depression in the surface of a standing wave of solder. Circuit boards to be soldered are passed through the crest of the molten solder wave and then, while the solder adhering to the component leads and conductors still is molten, into contact with the static pool of hot oil.

It is thus a primary object of the present invention to provide a mass soldering system, i.e. apparatus and process, which overcomes the aforesaid problems of the prior art.

Another object of the present invention is to provide an improved apparatus and process for mass soldering in which the problems of solder shorts, icicling and/or bridging are substantially reduced.

A more specific object is to provide an apparatus and process for mass soldering relatively high density circuit board assemblies.

The instant invention overcomes the foregoing and other problems by providing a method and apparatus for relocating or removing excess solder from mass soldered boards before the solder solidifies as shorts, icicles or bridges. The method includes the step of flowing oil (soldering oil or other suitable fluid) into contact with at least excess solder on the underside of a soldered board immediately following mass deposition of the molten solder onto the board. This contact acts on the underside of the board to relocate excess solder on, and/or removes excess solder therefrom and any interconnection, component leads and/or component bodies carried thereon before the solder solidifies as shorts, icicles or bridges. The action takes place closely adjacent the peel back point of the solder wave from the board.

In the following description the term "solder removal" is used to denote actual displacement of solder from a circuit board, and any interconnections, component leads and/or component bodies thereon, as well as relocation or solder on a circuit board, and any interconnections, component leads and/or component bodies thereon.

According to the present there is provided a method of mass joining with solder printed circuit boards and component leads of components mounted thereon, said method comprising the steps of:

depositing a quantity of molten solder onto the underside of said board and said component leads, and, substantially immediately following said depositing, flowing oil through said quantity of solder into contact with the underside of said board, said leads and molten solder thereon thereby to relocate or remove a portion of the molten solder deposited on said board and leads before said molten solder solidifies thereon.

According to the present invention there is also provided apparatus for mass joining with solder component leads components and a circuit board to which they are assembled, comprising in combination:

a mass soldering station adapted to hold a supply of molten solder;

means for transporting said circuit board through said soldering station whereby a quantity of molten solder may be deposited onto the underside of said board and leads, and an excess solder relocation or removal means adapted to flow oil through said supply of solder, when present in said station, into contact with solder deposited on said board and leads to remove or relocate any excess of said deposited molten solder from said board and leads before said molten solder solidifies thereon.

The present invention will now be described, by way of example, with reference to the accompanying drawings, in which.

In the following detailed description of the present invention, the term "component" refers to leadless components as well as components having conventional metallic conductors or leads. The term "component lead" refers to that part of metallic conductor of an electrical or electronic component that is joined to the printed circuit board pattern, i.e. the component leads, terminals, lugs, pins, etc. The term "land" as used herein refers to that part of the metallic pattern on the printed circuit board to which a component or component lead is joined by solder. The term "mass soldering" as used herein is intended to refer to any of the several soldering techniques known in the art in which liquid solder is applied to a circuit board from a reservoir of liquid solder, including, by way of example, but not limitation: wave soldering, touch or dip soldering, pot soldering, jet soldering, cascade soldering and drag soldering.

Figure 1:
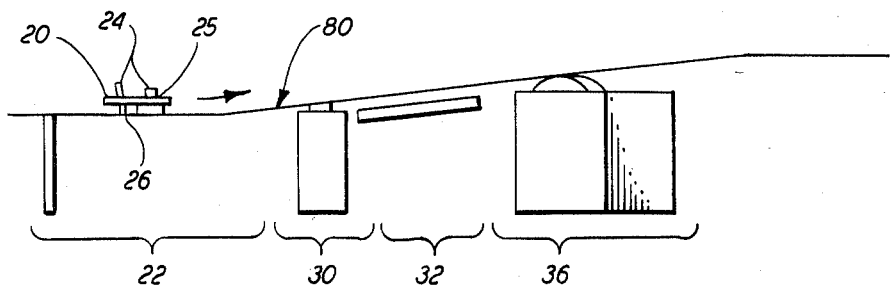
FIG. 1 is a diagrammatic side elevation of a mass soldering system according to the present invention.

Referring first to FIG. 1, a printed circuit board 20 is loaded at an insertion station 22, with a plurality of electrical or electronic components 24 at predetermined positions on the board. The board comprises an insulated wiring board having one or more printed metallic conductors on the board underside, and a plurality of apertures 25 which extend through the board. Components 24 are loaded onto the top side of the board with their leads 25 protruding downward through the board apertures 25 in juxtaposition to the circuit lands to which they are to be joined. The components may be inserted in the board by any method known in the art which may include manual assembly, semi-automatic, or automatic assembly which may comprise single-station or multiple-station pantograph or numerically controlled machines, all of which are well known in the art and need not be described further.

The next step involves treating the surfaces to be soldered with a so-called flux at a fluxing station 30. The flux may be any flux well known in the art and may include, for example, a water-white rosin flux, an activated rosin flux or a water soluble flux. The flux may be applied in fluxing station 30 by any manner well known in the art, for example, by spraying, foaming, brushing, or from a flux wave.

The board is then passed from fluxing station 30 to a preheating station 32 where the board is preheated to mobilize the flux and also drive off the bulk of the flux solvent to form an active flux layer on the board and leads. Preheating station 32 may comprise infrared or convection heaters or a combination of infrared and convection heaters as are well known in the art. Preferably, but not necessarily, preheating station 32 is extended as compared with conventional preheating stations, and/or preheating station 32 may be operated at higher than normal temperatures so that the board 20 is heated to higher than normal top side temperatures. Thus board 20 will be preheated to a minimum top side temperature of about 66° C.; preferably however, the board will be preheated to a top side temperature in the range of about 100° C.–125° C. or higher. The purpose of preheating the board to higher than normal top side temperatures is to increase the time the solder on the board remains molten after the board emerges from the solder wave. The reason for this will become clear from the description following.

The fluxed preheated board is then passed to a mass wave soldering station 36. Referring also to FIGS. 2 and 3 the wave soldering station includes a container of conventional design, indicated generally at 40, for holding a supply of molten solder 42. Conventional heating means (not shown) may be secured to the bottom and/or side walls of container 40 or immersed in the solder to heat and maintain the supply of solder 42 in molten condition.

A sump and nozzle assembly indicated generally at 44 is disposed interiorly of container 40. The sump and nozzle assembly 44 is of conventional design and typically comprises a rounded bottom wall 46, a pair of substantially vertically opposed end walls 48 and 50, and a pair of inclined side walls 52 and 54. The upper ends of end walls 40 and 50 and side walls 52 and 54 are spaced from one another to form a narrow elongate rectangular nozzle or slot 56 which extends above the molten solder level in container 40 for a suitable distance, e.g. one inch above the molten solder level.

Preferably, the sump also includes a pair of adjustable sluice plates 58A, 58B spaced from the sump side walls 52 and 54 for controlling solder overflow from the nozzle 56, e.g. in accordance with the teachings of U.S. Pat. No. 3,398,873 to Kenneth G. Boynton. Completing the portion of the soldering station is a variable speed pump (not shown) which communicates through an intake orifice 59 in the lower end of sump and nozzle assembly 44 for pumping solder into the sump where it then rises and overflows the nozzle 56 as a standing solder wave.

An important feature and critical requirement of the present invention is the ability to relocate excess solder on, and/or remove excess solder from the bottom of the circuit board, and from any interconnections, component leads and/or component bodies carried thereon before the solder can solidify as shorts, icicles and/or bridges. This is accomplished by treating the soldered circuit board and depending component leads at an excess solder relocation and/or removal station designed to relocate or remove excess solder from the board underside before the solder solidifies as shorts, icicles and/or bridges. The solder relocation and/or removal station forms a part of the mass soldering station 36.

Figure 2A:
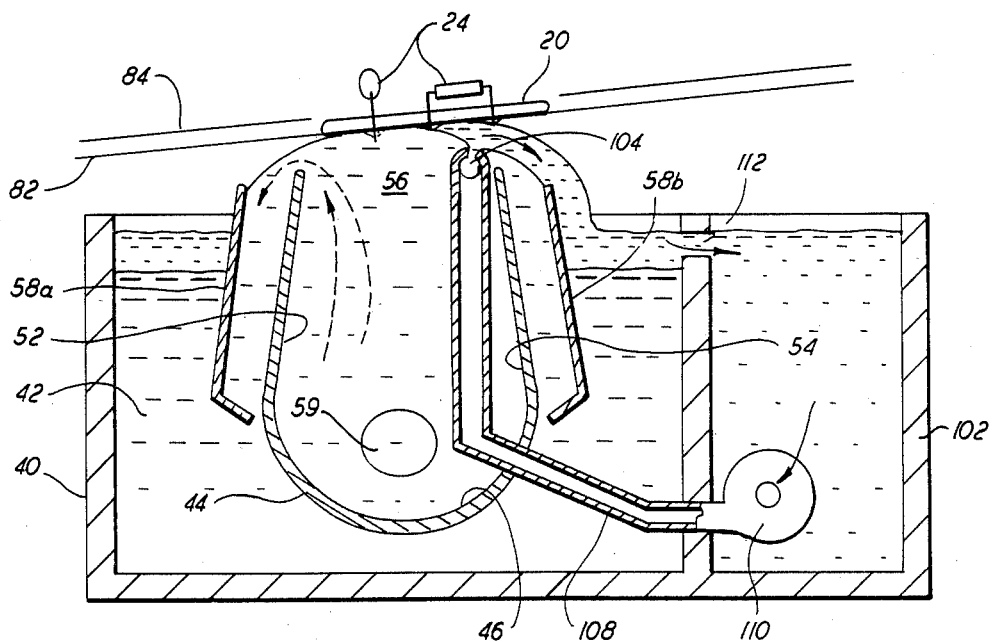
FIG. 2A is a side elevation, partly in section, of the soldering apparatus portion of the soldering system of FIG. 1, illustrating a first embodiment of the present invention.
Figure 2B:
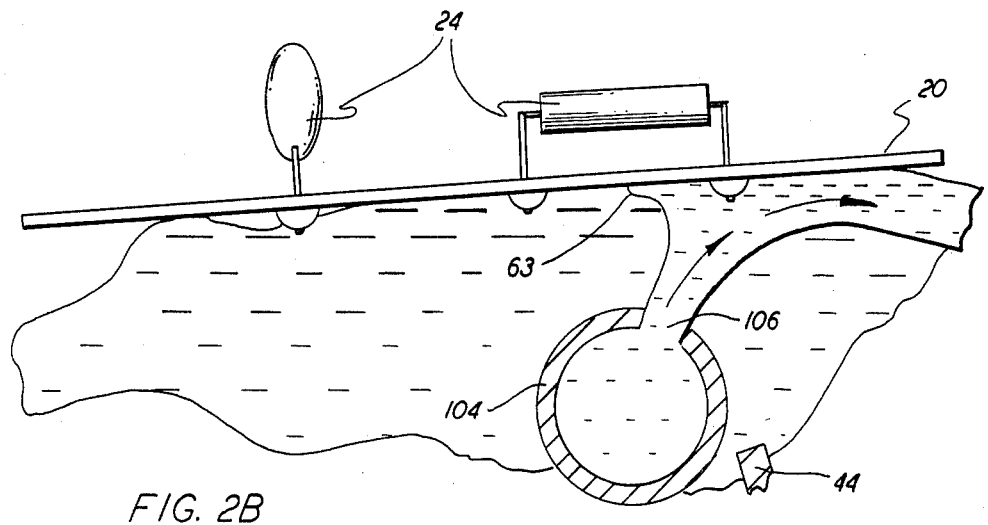
FIG. 2B is an enlarged illustration of a portion of FIG. 2A.
Figure 3:
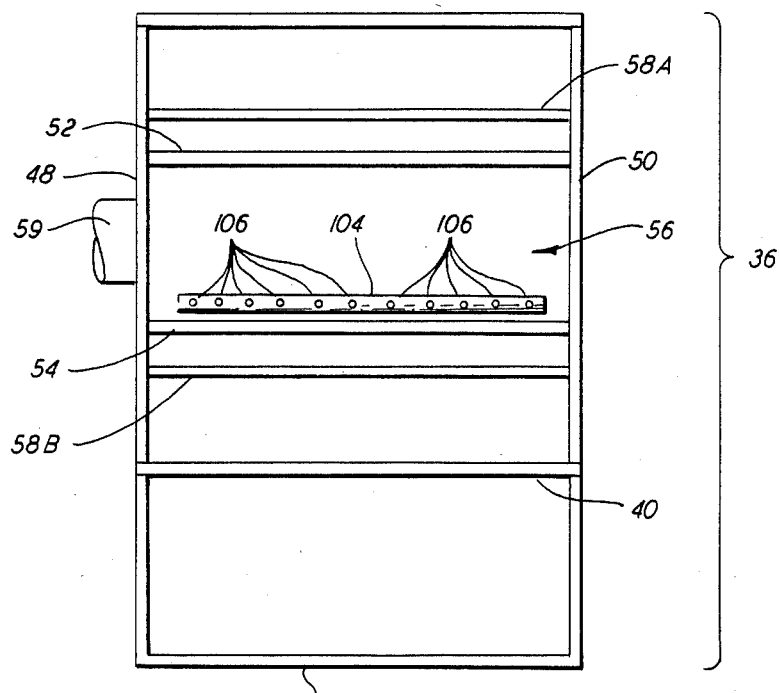
FIG. 3 is a plan view of the soldering apparatus portion of FIG. 2.

With reference to FIGS. 2A, 2B and 3, which illustrate a first embodiment of the present invention, the solder relocation and/or removal station includes a container 102 for holding a supply of oil (i.e., soldering oil) e.g., Peblum oil as manufactured by Shell Oil Company. Peblum oil is approximately 85% of an unfiltered HVI (high viscosity index) bright stock having a viscosity of about 200 Saybolt Universal Seconds at 210° F., 0.5% phenyl-alpha-naphthylamine, and the remainder a mixture of fatty acid material, about one-half of which is hydrogenated marine oil distillate and one-half unsaturated fatty acid. Additional information regarding compositions of this type may be found in U.S. Pat. No. 2,537,882 of George W. Waters. The oil must be a relatively inert oil, such as Peblum oil, and liquid from below room temperature, 68° F. to temperatures in excess of solder bath, 500° F. Conventional heating means (not shown) may be secured to the bottom and/or side walls of container 102 or immersed in the solder to heat and maintain the supply of oil at a temperature approximating that of the solder in the solder wave (i.e., about 260° C.) and in any event, higher than the liquidous temperature of the solder.

Extending parallel with and disposed within the nozzle slot 56 defined by the sump and nozzle assembly 44 is an elongate manifold 104 which defines a plurality of upward facing openings 106. The manifold 104 is connected by conduit 108 to receive oil from container 102 under the control of a variable speed pump 110 attached to and located within the container 102. Conduit 108 passes through the wall of container 40 and the lower portion of sump and nozzle assembly 44 in a sealed manner therewith. Under the control of pump 110 oil is emitted from openings 106, which are located below the surface of the solder wave just downstream of peel-back point 63, to penetrate the surface of the solder wave as a plurality of gushers to form above the surface of the solder wave a continuous stream of the oil which intimately contacts the still molten solder on and wets the undersurface of the board 20 immediately after it passes through the crest of the solder wave. The oil fills the space between the peel-back point 63, the top of the solder wave and the underside of the board downstream of the crest of the solder wave until freedom of flow over sluice plate 58b permits the oil to flow onto the upper surface of the solder in the container 40 upon which it floats to form a layer of oil which is free to flow by way of an opening(s) 112, located above the solder level, from the container 40 into the container 102.

The desired flow of oil results from appropriate choice of flow rates, flow pressures, the direction openings 106 face and their spacing, the degree of immersion of the manifold 104 under the surface of the solder wave, temperatures of the solder and oil etc. as will be easily determined by a man skilled in the art in any particular circumstance.

It will further be appreciated that the flow rate and pressure of the oil supplied through the openings 106 and moving across the undersurface of the board 20 will be arranged to be sufficient to remove excess solder from the underside of the board 20, while leaving the solder fillets substantially undisturbed.

Typically, in the case of Peblum oil, the oil will be supplied through openings 106 at a pressure of 5-20 pounds per square inch.

Excess solder is displaced from the underside of the board 20 by the flow of oil, at least partially as a result of the decreased surface tension of solder on the underside of the board in the presence of the oil, to be carried by the oil back into the container 40 for return to the solder in the container 40 and/or for carriage by the oil through the opening 112 for deposition in a catch area, not shown, in the container 102.

The design and location of openings 106 coupled with the separate pumping and supply of solder and oil, from container 102, to the location of the solder wave and immediate downstream area therefrom results in essentially no intermixing of the oil and solder, these remaining as separate entities for future recycling through their own systems.

If an alternative arrangement the pump 110 can be arranged or the manifold 104 designed to supply the oil intermittently through conduit 108 to the manifold 104, thereby to supply a plurality of bubbles seriatim through the openings 106 in place of the continuous flow of the gushers. In these circumstances the continuous presence of oil above the wave surface downstream of the peel-back point 63 will still be ensured.

The positioning of the manifold below the surface of the solder wave is arranged a distance sufficient to ensure that the profile of the solder wave is appropriate for the proper soldering of the underside of the board and components mounted thereon consistent with the flow of solder in a manner desired for circulation of the solder through the container 40 within the baffles 58a and 58b.

One skilled in the art will be able to determine experimentally the preferred operating parameters for achieving icicle-, bridge- and short-free mass soldering for the particular board being soldered in the embodiment illustrated in FIGS. 2 and 3.

While the manifold has been illustrated as being of circular cross section, it will be appreciated that the cross section may be other than circular. In particular, the cross section of manifold 104 may be streamlined in the direction of flow of solder in the solder wave, thereby to facilitate proper formation of that solder wave.

Completing the soldering system is a circuit board conveyor 80 of conventional construction. The latter comprises a pair of spaced conveyor rails 82 and 84 and suitable drive means (not shown) for carrying a circuit board from the insertion station 22 through the fluxing station 30, wave soldering station and excess solder removal station 36.

Figure 4:
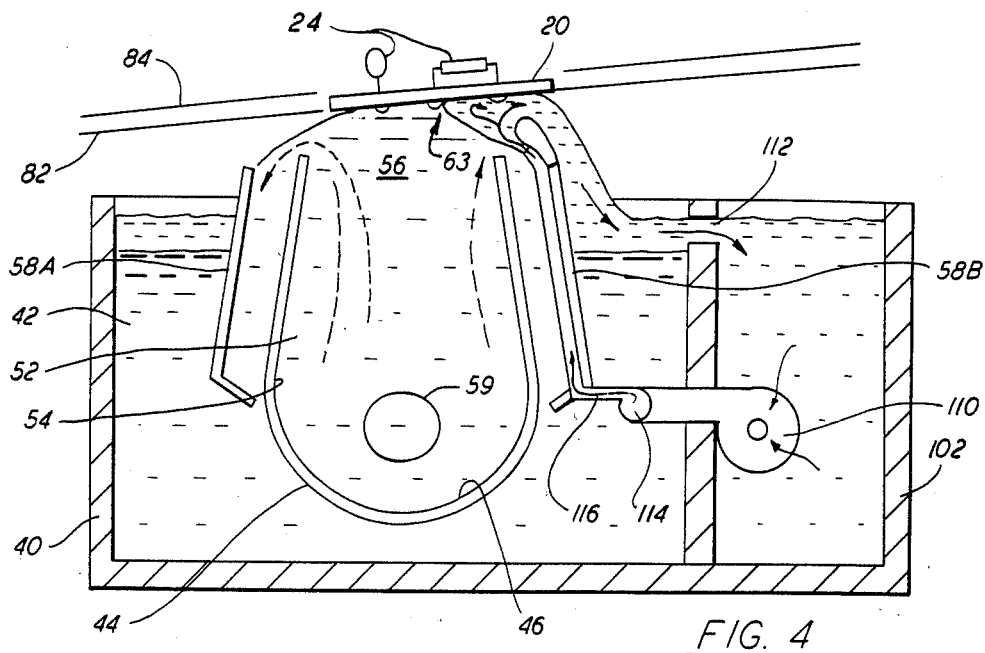
FIG. 4 is a diagrammatic side elevation, partly in section, of the soldering apparatus portion of the soldering system of FIG. 1 illustrating a second embodiment of the present invention.
Figure 5:
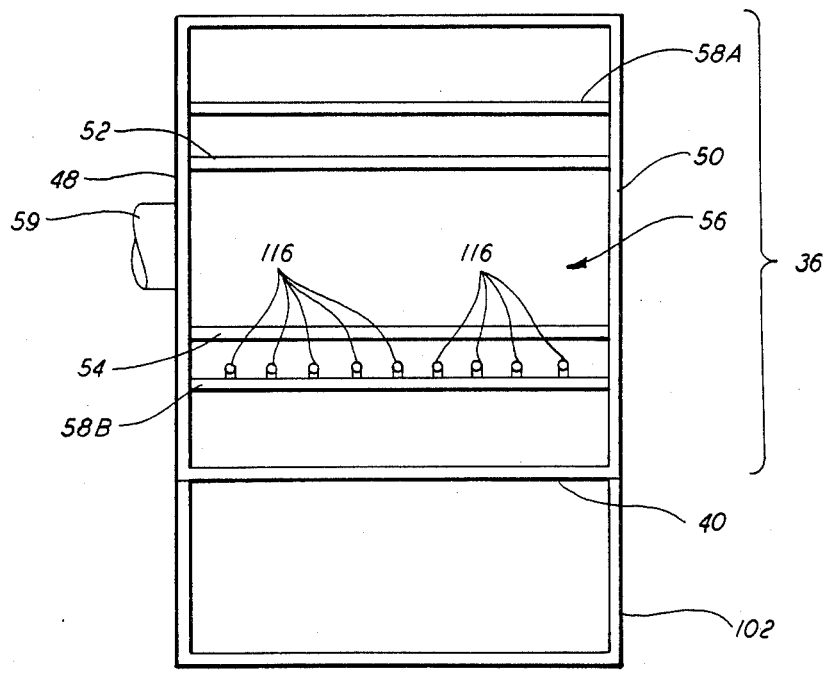
FIG. 5 is a plan view of the soldering apparatus portion of FIG. 4.

With reference now to FIGS. 4 and 5, which illustrate a second embodiment of the present invention in which a solder relocation and/or removal station is combined with the wave soldering station 36 downstream thereof relative to the direction of conveyance of a board 20 through the mass soldering system. In this second embodiment a variable displacement pump 110 supplies oil to a manifold 114 extending across the width of container 40 below the surface of solder therein. The manifold 114 distributes oil to a plurality of supply tubes 116 mounted on the inner surface of sluice plate 58b and extending upwardly along this sluice plate to terminate within the solder wave at a point adjacent the surface thereof downstream of the peel-back point 63 of that solder wave from the undersurface of a board 20 as it passes through the crest of that wave. From this point on, a plurality of gushers of oil issue to form a continuous layer of oil contacting the underside of board 20 flowing therefrom back onto the surface of the solder in the container 20 and by way of an opening 112 back into the container 102 in a similar manner to the arrangement described with reference to FIGS. 2 and 3. In the same manner a plurality of bubbles may replace the gushes. This second embodiment has an advantage over the first embodiment hereinbefore described in that the plurality of supply tubes terminating adjacent the surface of the solder wave can more easily be designed and positioned to limit the effect of the oil gushers and tubes on the form and flow of the solder wave itself. In this arrangement, and using Peblum oil, a pressure of oil supplied from the supply tubes may be approximately 5–20 pounds per square inch.

As with the first embodiment, it will be appreciated that one skilled in the art will be able to determine experimentally the preferred operating parameters for achieving icicle-, bridge- and short-free mass soldering for the particular board being soldered in the embodiment of FIGS. 4 and 5.

It will also be appreciated that the position shown for the termination of the supply tube 116 adjacent the surface of the solder wave may be varied in dependence upon the requirement for filling the space between the peel-back point 63, the underside of a board 20 passing through the crest of that wave and the upper surface of the solder wave itself downstream of the peel-back point.

Figure 6:
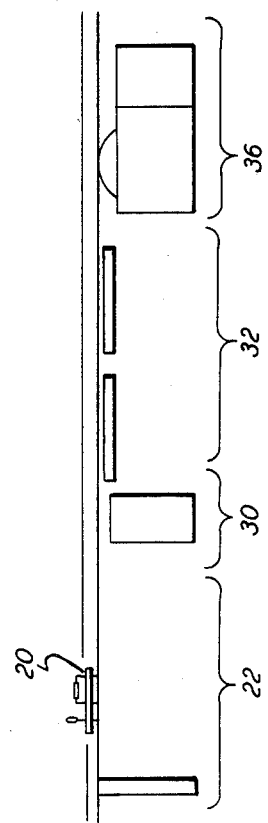
FIG. 6 is a diagrammatic side elevation of a second soldering apparatus including the present invention, taken along the travel path of a circuit board.

Referring now to FIG. 6, which illustrates a second form of mass wave soldering system in accordance with the present invention shown in the second embodiment of the invention. The mass wave soldering system illustrated in FIG. 6 has many similarities to the mass wave soldering system shown in FIG. 1. Thus for example, the mass wave soldering system in accordance with the present invention also includes a loading station 22, a fluxing station 30, a preheating station 32 and a mass wave soldering station 36. However, in contrast to the system of FIG. 1 the board 22 is carried substantially horizontally through the crest of the solder wave. It will be appreciated that the other embodiments of the present invention could also be used in conjunction with horizontal conveyance of boards through the crest of the solder wave.

Also preferred but not essentially required, is the extension of the preheating station 32 as compared with conventional preheating stations, and/or the operation of the preheating station 32 at higher than normal temperatures, so that the board 22 will be heated to a top side temperature 14° to 28° C. or more higher than normal. Thus, for example, board 22 may be preheated in accordance with the present invention to a minimum top side temperature of about 66° C., preferably a top side temperature in the range of about 79° C. to 121° C. The purpose of preheating the board to higher than normal top side temperature is to increase the time the solder on the board remains molten after the board emerges from the solder wave.

As described in connection with the first and second embodiments, excess solder is relocated and/or removed from the bottom of board 20 substantially immediately after the board emerges from the solder wave at solder relocation and/or removal station 100 as described with reference to those Figures. The higher temperatures ensure relocation or removal of excess solder notwithstanding the reduced peel-back angle resulting from operating in the horizontal mode.

Beyond this the operation and arrangement of the system of FIG. 6 is essentially the same as that described above for the system shown in FIG. 1.

Various changes may be made in the foregoing invention without departing from the inventive features described herein. For example, one or more banks of heaters, similar in construction to the preheaters may be incorporated into the excess solder relocation and/or removal station to extend the time the solder remains molten on the board.

While the solder relocation and/or removal system in accordance with the present invention has been illustrated in conjunction with a mass wave soldering of printed circuit boards, one skilled in the art will recognize that similar advantages may be achieved by employing a solder removal station in conjunction with other types of mass soldering systems such as cascade and drag soldering systems. The solder relocation and/or removal system also may be advantageously employed for mass tinning of multi-lead components such as DIP's, SMD's and the like. Still other changes will be obvious to one skilled in the art. Accordingly, it is intended that all matter contained in the above description or shown in the accompanying drawings shall be interpreted in an illustrative and not in a limiting sense.

I claim:

1. A method of reducing the incidence of solder shorts, icicling and/or bridging in a mass soldering process in which a quantity of molten solder is deposited onto the underside of a component-carrying printed circuit boards and onto those parts of said components which extend below said board underside so as to at least partially fill with molten solder any holes in said board, said method comprising the steps of:

depositing a quantity of molten solder onto the underside of said board and said component by passing the underside of said board and said component parts at least in part in contact with a wave of molten solder, and, substantially immediately following said depositing, flowing oil into contact with the underside of said board, said component parts and molten solder thereon thereby to relocate or remove a portion of the molten solder deposited on said board and component parts before said molten solder solidifies thereon, said supply of oil being flowed through said solder wave into contact in part with the underside of said board and said component parts to create a stream of substantial thickness to substantially completely immerse the joints being formed, said immersion of said joints occurring substantially immediately following removal of said board underside from contact of said board and component parts with said solder wave.

2. A method according to claim 1, wherein said oil in contact with said board has a temperature at least equal to that of solder in said wave.

3. A method of mass joining with solder printed circuit boards and component leads of components mounted thereon, said method comprising the steps of:

depositing a quantity of molten solder onto the underside of said board and said component leads, and, substantially immediately following said depositing, flowing oil into contact with the underside of said board, said leads and molten solder thereon thereby to relocate or remove a portion of the molten solder deposited on said board and leads before said molten solder solidifies thereon, said molten solder being deposited onto said board and component leads by passing the underside of said board and said leads at least in part in contact with a wave of molten solder, and said supply of oil being flowed through said solder wave into contact with the underside of said board, said leads and molten solder thereon substantially immediately following contact of said board and leads with said solder wave, said oil in contact with said board having a temperature at least equal to that of solder in said wave, said supply of oil being streamed into said solder wave, and emerging from said solder wave as a plurality of gushers of oil to form a layer of oil on said wave in contact with the underside of said board downstream of the crest of said wave in the direction of the passing of said board through contact with said wave.

4. A method according to claim 2 wherein said supply of oil is bubbled into said solder wave, and emerges from said solder wave as a plurality of individual bubbles of oil to form a layer of oil on said wave in contact with the underside of said board downstream of the crest of said wave in the direction of the passing of said board through contact with said wave.

5. A method according to claim 1, wherein said board is transported substantially horizontally through its contact with said wave of molten solder.

6. A method according to claim 1, wherein said oil contacts said board immediately following peel-back of said wave from the underside of the board.

7. Apparatus for mass joining with solder leads of components and a circuit board to which they are assembled, comprising in combination:

a mass soldering station adapted to hold a supply of molten solder;

means for transporting said circuit board through said soldering station whereby a quantity of molten solder may be deposited onto the underside of said board and leads, and an excess solder relocation or removal means adapted to flow oil though said supply of solder, when present in said station, into contact with solder deposited on said board and leads to remove or relocate any excess of said deposited molten solder from said board and leads before said molten solder solidifies thereon, said soldering statin being a mass wave soldering station adapted to generate a standing wave of molten solder, said transporting means being arranged to transport said circuit board into and through contact with the upper crest of said standing wave and said excess solder relocation or removal means comprising means to pass oil through said wave, into contact with the underside of said board to create a stream of oil of substantial thickness in which the joints being formed are substantially completely immersed, said immersion of said joints occurring substantially immediately following removal of said board underside from contact of said board and leads with said solder wave.

8. Apparatus according to claim 7, wherein said excess solder relocation or removal means is adapted to flow said oil through said solder wave as a plurality of gushers of oil to form a layer of oil on said wave in contact with molten solder deposited on the underside of said board and leads downstream of the crest of said wave in the direction of the passing of said board through contact with said wave.

9. Apparatus according to claim 7, wherein said excess solder relocation and removal means is adapted to flow said oil through said solder wave as a serial plurality of individual bubbles of oil to form a layer of oil on said wave in contact with molten solder deposited on the underside of said board and leads downstream of the crest of said wave in the direction the of passing of said board through contact with said wave.

10. Apparatus according to claim 7, wherein said transporting means is arranged to transport said circuit board in a substantially horizontal travel path into and through said soldering station.

11. Apparatus according to claim 7, wherein said excess solder relocation or removal means supplies oil to contact said board immediately following peel-back of said wave from the underside of the board.

12. Apparatus according to claim 9, wherein said excess solder relocation or removal means has an oil distribution manifold located within said mass soldering station at a position within said supply of molten solder when present in said station, said manifold being arranged to supply a plurality of outlets with said oil to provide passage of oil through said supply of solder, when present in said station, in direct contact with said solder.

13. Apparatus according to claim 12, wherein said soldering station is a mass wave soldering station adapted to generate a standing wave of solder, said transporting means are arranged to transport said circuit board into and through contact with the crest of said standing wave and said outlets of said manifold are disposed within said standing wave, when present in said station, downstream of said crest in the direction of the passage of said circuit board through contact with said crest.

14. Apparatus according to claim 13, wherein said manifold is an elongate manifold defining an aligned plurality of said outlets and disposed in said solder wave, when present in said station, parallel to said crest of said standing wave.

15. Apparatus for mass joining with solder leads of components and a circuit board to which they are assembled, comprising in combination:
a mass soldering station adapted to hold a supply of molten solder;
means for transporting said circuit board through said soldering station whereby a quantity of molten solder may be deposited onto the underside of said board and leads, and
an excess solder relocation or removal means adapted to flow oil through said supply of solder, when present in said station, into contact with solder deposited on said board and leads to remove or relocate any excess of said deposited molten solder from said board and leads before said molten solder solidifies thereon, said excess solder relocation or removal means having an oil distribution manifold located within said mass soldering station at a position within said supply of molten solder when present in said station, said manifold being arranged to supply a plurality of outlets with said oil to provide passage of oil through said supply of solder, when present in said station, in direct contact with said solder, said soldering station being a mass wave soldering station adapted to generate a standing wave of solder, said transporting means being arranged to transport said circuit board into and through contact with the crest of said standing wave and said outlets of said manifold being disposed within said standing wave, when present in said station, downstream of said crest in the direction of the passage of said circuit board through contact with said crest, said manifold being located in said mass of solder, when present in said station, remote from said standing wave of molten solder, when present in said station, and being connected by conduits to said outlets within said standing wave.

16. Apparatus for mass joining with solder leads of components and a circuit board to which they are assembled, comprising in combination;
a mass soldering station adapted to hold a supply of molten solder;
means for transporting said circuit board through said soldering station whereby a quantity of molten solder may be deposited onto the underside of said board and leads, and
an excess solder relocation or removal means adapted to flow oil though said supply of solder, when present in said station, into contact with solder deposited on said board and leads to remove or relocate any excess of said deposited molten solder from said board and leads before said molten solder solidifies thereon, wherein said excess solder relocation or removal means has an oil distribution manifold located within said mass soldering station at a position within said supply of molten solder when present in said station, said manifold being arranged to supply a plurality of outlets with said oil to provide passage of oil through said supply of solder, when present in said station, in direct contact with said solder, said excess solder relocation and removal means having a container adapted to contain oil, a pump having an inlet to receive oil from said oil container and an outlet connected to said manifold to deliver oil under pressure thereto, said oil container being arranged to receive the oil following contact of said oil with said board and leads.

17. Apparatus according to claim 16, wherein said mass soldering station, in operation, is arranged to receive oil, following its contact with said board and leads, onto the surface of said mass of solder therein and is connected by a port, located above said mass of solder, to said oil container for the return of said oil thereto.

18. A method of pretinning the leads of a multilead component, said method comprising the steps of:
depositing a quantity of molten solder onto the underside of said component and said component leads, and, substantially immediately following said depositing, flowing oil through said quantity of solder into contact with the underside of said board, said leads and molten solder thereon thereby to relocate or remove a portion of the molten solder deposited on said component and leads before said molten solder solidifies thereon, said molten solder being deposited onto said component and component leads by passing the underside of said component and said leads at least in part in contact with a wave of molten solder, and said supply of oil being flowed through said solder wave into contact with the underside of said board to create a stream of oil of substantial thickness to substantially completely immerse said leads, said immersion of said leads occurring substantially immediately following removal of said board underside from contact of said board and leads with said solder wave.

19. A method according to claim 18, wherein said oil in contact with said component has a temperature at least equal to that of solder in said wave.

20. A method according to claim 19, wherein said supply of oil is streamed into said solder wave, and emerges from said solder wave as a plurality of gushers of oil to form a layer of oil on said wave in contact with the underside of said component downstream of the crest of said wave in the direction of the passing of said component through contact with said wave.

21. A method according to claim 19, wherein said supply of oil is bubbled into said solder wave, and emerges from said solder wave as a plurality of individual bubbles of oil to form a layer of oil on said wave in contact with the underside of said component downstream of the crest of said wave in the direction of the passing of said component through contact with said wave.

22. A method according to claim 18, wherein said component is transported substantially horizontally through its contact with said wave of molten solder.

23. A method according to claim 18, wherein said oil contacts said component immediately following peelback of said wave from the underside of the component.

24. Apparatus for pretinning the leads of a multilead component comprising in combination:
- a mass soldering station adapted to hold a supply of molten solder;
- means for transporting said component through said soldering station whereby a quantity of molten solder may be deposited onto the underside of said component and leads, and
- an excess solder relocation or removal means adapted to flow oil through said supply of solder, when present in said station, into contact with solder deposited on said component and leads to remove or relocate any excess of said deposited molten solder from said component and leads before said molten solder solidifies thereon, said soldering station being a mass wave soldering station adapted to generate a standing wave of molten solder, said transporting means being arranged to transport said component into and through contact with the upper crest of said standing wave and said excess solder relocation or removal means comprising means to pass oil through said wave, into contact with the underside of said board to create a stream of oil of substantial thickness in which said leads and molten solder thereon are substantially completely immersed, said immersion of said leads occurring substantially immediately following removal of said board underside from contact of said board and leads with said solder wave.

25. Apparatus according to claim 24, wherein said excess solder relocation or removal means is adapted to flow said oil through said solder wave as a plurality of gushers of oil to form a layer of oil on said wave in contact with molten solder deposited on the underside of said component and leads downstream of the crest of said wave in the direction of the passing of said component through contact with said wave.

26. Apparatus according to claim 24, wherein said excess solder relocation and removal means is adapted to flow said oil through said solder wave as a serial plurality of individual bubbles of oil to form a layer of oil on said wave in contact with molten solder deposited on the underside of said component and leads downstream of the crest of said wave in the direction the of passing of said component through contact with said wave.

27. Apparatus according to claim 24, wherein said transporting means is arranged to transport said component in a substantially horizontal travel path into and through said soldering station.

28. Apparatus according to claim 24, wherein said excess solder relocation or removal means supplies oil to contact said component immediately following peelback of said wave from the underside of the board.

29. Apparatus according to claim 28, wherein said excess solder relocation or removal means has an oil distribution manifold located within said mass soldering station at a position within said supply of molten solder when present in said station, said manifold being arranged to supply a plurality of outlets with said oil to provide passage of oil through said supply of solder, when present in said station, in direct contact with said solder.

30. Apparatus according to claim 29, wherein said soldering station is a mass wave soldering station adapted to generate a standing wave of solder, said transporting means are arranged to transport said component into and through contact with the crest of said standing wave and said outlets of said manifold are disposed within said standing wave, when present in said station, downstream of said crest in the direction of the passage of said component through contact with said crest.

31. Apparatus according to claim 30, wherein said manifold is an elongate manifold defining an aligned plurality of said outlets and disposed in said solder wave, when present in said station, parallel to said crest of said standing wave.

32. Apparatus for pretinning the leads of a multilead component comprising in combination:
- a mass soldering station adapted to hold a supply of molten solder;
- means for transporting said component through said soldering station whereby a quantity of molten solder may be deposited onto the underside of said component and leads, and
- an excess solder relocation or removal means adapted to flow oil through said supply of solder, when present in said station, into contact with solder deposited on said component and leads to remove or relocate any excess of said deposited molten solder from said component and leads before said molten solder solidifies thereon, said excess solder relocation or removal means having an oil distribution manifold located within said mass soldering station at a position within said supply of molten solder when present in said station, said manifold being arranged to supply a plurality of outlets with said oil to provide passage of oil through said supply of solder, when present in said station, in direct contact with said solder said soldering station is a mass wave soldering station adapted to generate a standing wave of solder, said transporting means are arranged to transport said component into and through contact with the crest of said standing wave and said outlets of said manifold are disposed within said standing wave, when present in said station, downstream of said crest in the direction of the passage of said component through contact with said crest said manifold being located in said mass of solder, when present in said station, remote from said standing wave of molten solder, when present in said station, and being connected by conduits to said outlets within said standing wave.

33. Apparatus according to claim 32, wherein said excess solder relocation and removal means has a container adapted to contain oil, a pump having an inlet to receive oil from said oil container and an outlet connected to said manifold to deliver oil under pressure thereto, said oil container being arranged to receive the oil following contact of said oil with said component and leads.

34. Apparatus according to claim 33, wherein said mass soldering station, in operation, is arranged to receive oil, following its contact with said component and leads, onto the surface of said mass of solder therein and is connected by a port, located above said mass of solder, to said oil container for the return of said oil thereto.

* * * * *

UNITED STATES PATENT AND TRADEMARK OFFICE
CERTIFICATE OF CORRECTION

PATENT NO. : 4,566,624
DATED : January 28, 1986
INVENTOR(S) : Matthias COMERFORD It is certified that error appears in the above—identified patent and that said Letters Patent is hereby corrected as shown below:

Claim 1, line 5, the term "boards" should be "board".
Claim 7, line 19, the term "statin" should be "station".
Claim 9, line 48, the phrase "the of passing" should be "of the passing.

Signed and Sealed this

Second Day of September 1986

[SEAL]

Attest:

Attesting Officer

DONALD J. QUIGG

Commissioner of Patents and Trademarks